US011343921B2

(12) United States Patent
Sumida et al.

(10) Patent No.: US 11,343,921 B2
(45) Date of Patent: May 24, 2022

(54) ELECTRONIC UNIT

(71) Applicants: AutoNetworks Technologies, Ltd., Mie (JP); Sumitomo Wiring Systems, Ltd., Mie (JP); Sumitomo Electric Industries, Ltd., Osaka (JP)

(72) Inventors: Tatsuya Sumida, Mie (JP); Kyohei Morita, Mie (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 205 days.

(21) Appl. No.: 16/638,164

(22) PCT Filed: Aug. 10, 2018

(86) PCT No.: PCT/JP2018/030016
§ 371 (c)(1),
(2) Date: Feb. 11, 2020

(87) PCT Pub. No.: WO2019/044454
PCT Pub. Date: Mar. 7, 2019

(65) Prior Publication Data
US 2021/0153362 A1 May 20, 2021

(30) Foreign Application Priority Data

Aug. 31, 2017 (JP) .............................. JP2017-166668

(51) Int. Cl.
*H01F 27/00* (2006.01)
*H05K 5/00* (2006.01)
(Continued)

(52) U.S. Cl.
CPC ......... *H05K 5/0008* (2013.01); *H05K 1/0215* (2013.01); *H05K 5/04* (2013.01);
(Continued)

(58) Field of Classification Search
CPC ...... H05K 5/0008; H05K 5/04; H05K 5/0052; H05K 5/006; H05K 5/0056; H05K 9/0049;
(Continued)

(56) References Cited

U.S. PATENT DOCUMENTS 4,138,711 A * 2/1979 Bremenour ............ H05K 5/026
200/51.1
5,107,404 A * 4/1992 Tam ........................ H04B 1/38
361/736
(Continued)

FOREIGN PATENT DOCUMENTS

JP S58-95097 U 6/1983
JP H3-4080 U 1/1991
(Continued)

OTHER PUBLICATIONS

International Search Report, Application No. PCT/JP2018/030016, dated Oct. 30, 2018. ISA/Japan Patent Office.

*Primary Examiner* — Anatoly Vortman
*Assistant Examiner* — Zhengfu J Feng
(74) *Attorney, Agent, or Firm* — Honigman LLP (57) ABSTRACT

An electronic unit includes a first case made of metal; a second case made of metal; a frame made of synthetic resin arranged inside an assembly of the first case and the second case; a relay member made of metal that is separate from the frame and includes a first connection portion electrically connected to the first case, a second connection portion electrically connected to the second case, and a coupling portion coupling the first connection portion and the second
(Continued)

connection portion; a first screw that passes through the first case and the first connection portion from the outside of the first case and is fixed to the frame; and a second screw that passes through the second case and the second connection portion from the outside of the second case and is fixed to the frame.

11 Claims, 8 Drawing Sheets

(51) Int. Cl.
    *H05K 1/02*         (2006.01)
    *H05K 5/04*         (2006.01)
    *H05K 9/00*         (2006.01)
    *H01R 4/34*         (2006.01)
    *H01R 12/51*       (2011.01)

(52) U.S. Cl.
    CPC .............. *H05K 9/0049* (2013.01); *H01R 4/34* (2013.01); *H01R 12/51* (2013.01)

(58) Field of Classification Search
    CPC ........ H05K 7/142; H05K 1/0215; H01R 4/34; H01R 12/51
    USPC ......................................................... 361/748
    See application file for complete search history.

(56) References Cited

U.S. PATENT DOCUMENTS

| | | | | |
|---|---|---|---|---|
| 5,740,019 A | * | 4/1998 | Lee ........................ | H05K 7/142 |
| | | | | 361/752 |
| 5,880,930 A | * | 3/1999 | Wheaton ............ | H05K 7/20436 |
| | | | | 361/690 |
| 5,999,406 A | * | 12/1999 | McKain ............... | G11B 31/006 |
| | | | | 165/80.3 |

FOREIGN PATENT DOCUMENTS

| | | | | | |
|---|---|---|---|---|---|
| JP | H5-45626 A | | 2/1993 | | |
| JP | 08107285 A | * | 4/1996 | .............. | H05K 9/00 |
| JP | H8-107285 A | | 4/1996 | | |
| JP | 2004-095973 A | | 3/2004 | | |
| JP | 2012-064665 A | | 3/2012 | | |
| JP | 2012064665 A | * | 3/2012 | .............. | H05K 9/00 |

* cited by examiner

ELECTRONIC UNIT

CROSS-REFERENCE TO RELATED APPLICATIONS

This application is the U.S. national stage of PCT/JP2018/030016 filed on Aug. 10, 2018, which claims priority of Japanese Patent Application No. JP 2017-166668 filed on Aug. 31, 2017, the contents of which are incorporated herein.

TECHNICAL FIELD

This specification discloses a technology relating to an electronic unit.

BACKGROUND

The electronic unit disclosed in JP 2004-95973A is known as an electronic unit including a metal case housing a circuit board. In this electronic unit, the metal case and the land of the circuit board are soldered to each other. This configuration reduces the influence of noise from the outside of the electronic unit and suppresses emission of noise produced inside the electronic unit to the outside.

DISCLOSURE

However, with the above-mentioned configuration, the metal case and the circuit board are soldered to each other, and therefore, maintenance cannot be performed on the electronic unit without unsoldering the circuit board.

The present disclosure was achieved based on the foregoing circumstances, and it is an object thereof to improve the ease of performing maintenance on an electronic unit.

SUMMARY

An electronic unit according to the technology disclosed in this specification includes: a first case made of metal; a second case made of metal; a frame made of synthetic resin arranged inside an assembly of the first case and the second case; a relay member made of metal that is separate from the frame and includes a first connection portion electrically connected to the first case, a second connection portion electrically connected to the second case, and a coupling portion coupling the first connection portion and the second connection portion; a first screw that passes through the first case and the first connection portion from the outside of the first case and is fixed to the frame; and a second screw that passes through the second case and the second connection portion from the outside of the second case and is fixed to the frame.

With the above-mentioned configuration, the first case and the second case can be easily removed from the frame by removing the first screw and the second screw from the frame, thus making it possible to improve the ease of performing maintenance on the electronic unit.

Moreover, with the above-mentioned configuration, the frame made of synthetic resin and the relay member made of metal are fixed using the first screw and the second screw. Accordingly, compared with a case where a metal member is embedded in the frame using a method such as insert molding or press fitting, the generation of force caused by a difference between linear expansion coefficients is suppressed in the frame made of synthetic resin.

The following embodiments are preferred as embodiments of the technology disclosed in this specification.

It is preferable that the relay member includes at least one of a first contact protrusion protruding from the first connection portion toward the first case and a second contact protrusion protruding from the second connection portion toward the second case.

With the above-mentioned configuration, the first connection portion and the first case are electrically connected via the first contact protrusion. In addition, the second connection portion and the second case are electrically connected via the second contact protrusion. As a result, the electrical connection portions can be reliably designed, thus making it possible to improve the reliability of electrical connection in the electronic unit.

It is preferable that the frame includes a holding groove that holds the coupling portion.

This configuration facilitates the positioning of the relay member relative to the frame.

It is preferable that at least one of a first temporary locking means that temporarily locks the first connection portion to the frame, and a second temporary locking means that temporarily locks the second connection portion to the frame is included.

This configuration makes it easy to attach the relay member to the frame.

A configuration can be employed in which a circuit board is arranged inside the assembly of the first case and the second case, and a ground pattern that is electrically connected to at least one of the first connection portion and the second connection portion is formed on the circuit board.

With the above-mentioned configuration, the ground pattern of the circuit board and the second connection portion are electrically connected to each other. Thus, the ground pattern of the circuit board and the first case are electrically connected via the coupling portion and the first connection portion. As a result, the circuit board can be protected from noise, and the leakage of noise produced by the circuit board to the outside can be suppressed.

Advantageous Effects of Disclosure

With the technology disclosed in this specification, the ease of performing maintenance on an electronic unit can be improved.

DETAILED DESCRIPTION OF PREFERRED EMBODIMENTS

Embodiment 1

Embodiment 1 according to the technology disclosed in this specification will be described with reference to FIGS. 1 to 6. An electronic unit 10 of this embodiment is to be mounted in a vehicle (not shown) and used as an auxiliary power supply while idling of an engine is suspended or when an engine is restarted, for example. In the description below, the X direction shown in the diagrams indicates a "right side", the Y direction indicates a "front side", and the Z direction indicates an "upper side". Moreover, in the description below, where identical members are included, only one of the members may be denoted by a reference numeral, and the other members may not be denoted by the reference numeral.

Figure 1:
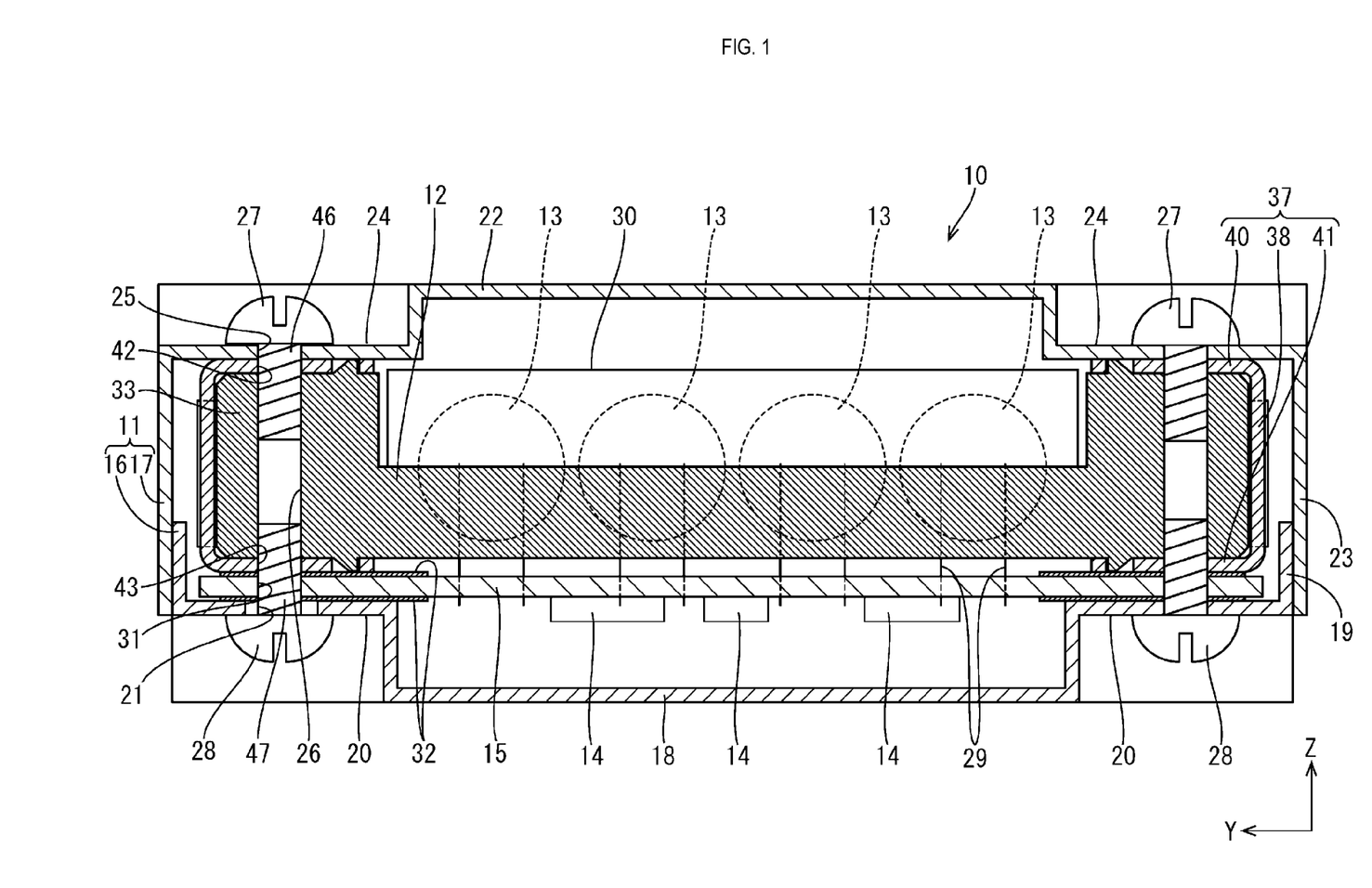
FIG. 1 is a cross-sectional view of an electronic unit according to Embodiment 1.
Figure 2:
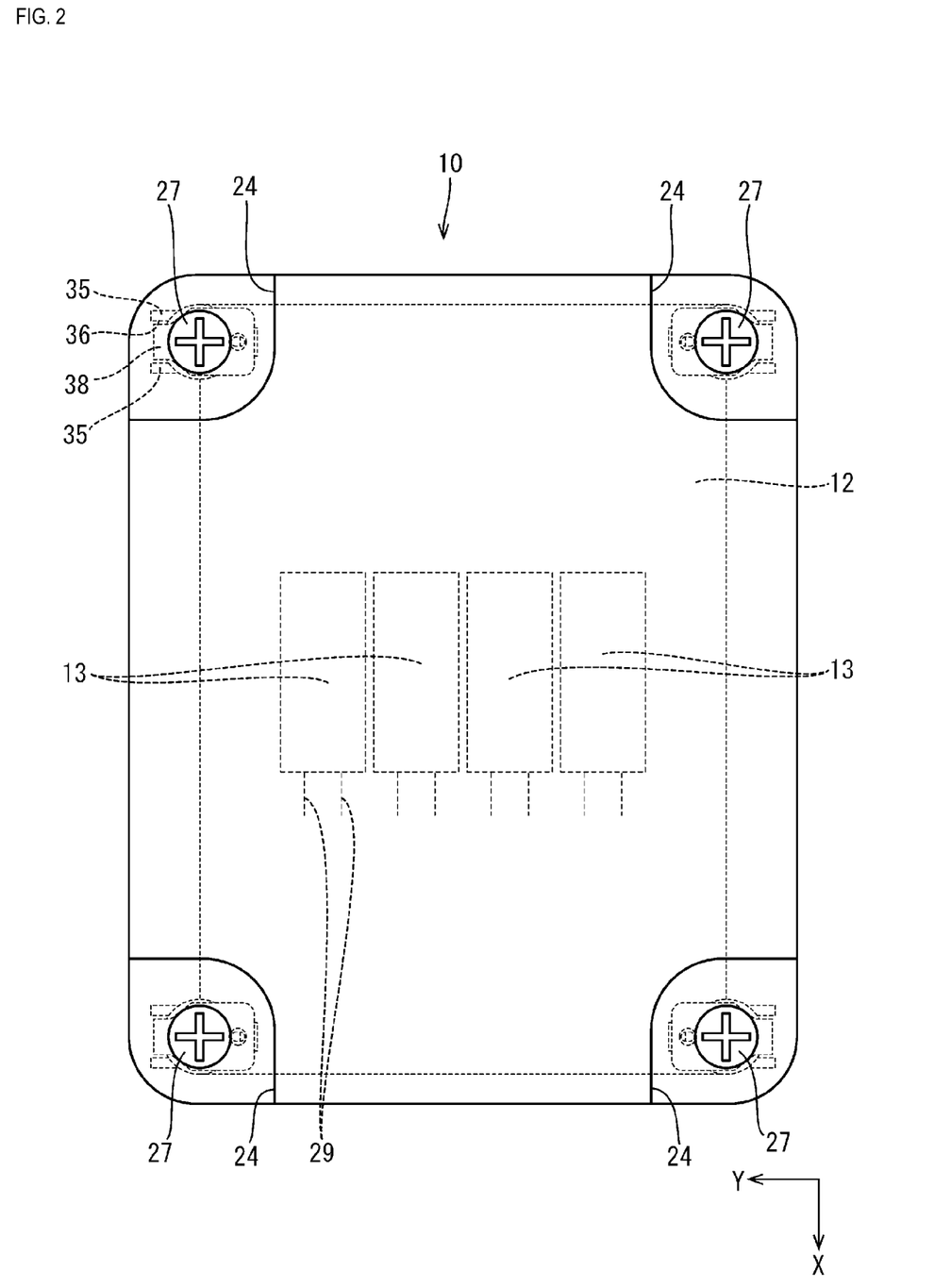
FIG. 2 is a plan view of the electronic unit.
Figure 3:
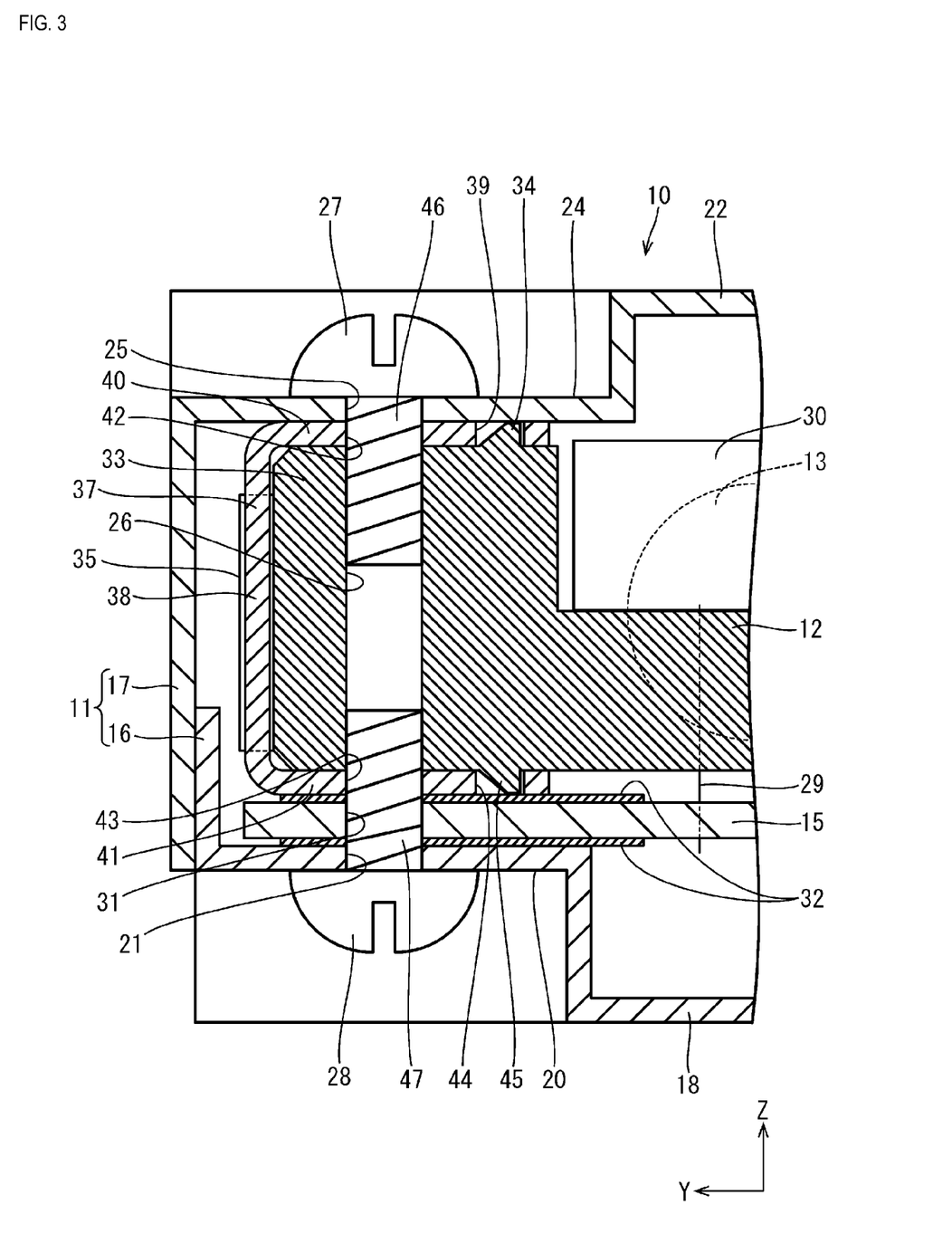
FIG. 3 is a partially enlarged cross-sectional view of the electronic unit.

As shown in FIGS. 1 to 3, the electronic unit 10 includes a case 11 made of metal in which a frame 12 made of synthetic resin is arranged. The frame 12 holds a plurality of capacitors 13. A circuit board 15 on which electronic parts 14 for controlling charge and discharge of the capacitors 13 are mounted is housed in the case 11.

As shown in FIG. 1, the case 11 made of metal includes a second case 16 that is open upward, and a first case 17 that is open downward and is to be attached to the second case 16 from above. The second case 16 and the first case 17 are made of metal.

The second case 16 includes a bottom wall 18 that has a substantially rectangular shape as viewed from above, and a side wall 19 that extends upward from the side edge of the bottom wall 18. Recessed portions 20 that are recessed upward are provided at the four corners of the bottom wall 18. A second case through hole 21 passes through each recessed portion 20 in the vertical direction.

The first case 17 includes a top wall 22 that has a substantially rectangular shape as viewed from above, and a side wall 23 that extends downward from the side edge of the upper wall 22. In a state in which the second case 16 and the first case 17 are attached to each other, the side wall 23 of the first case 17 is located outside the side wall 19 of the second case 16. In other words, the first case 17 is configured to be fitted over the second case 16. Recessed portions 24 that are recessed downward are provided at the four corners of the top wall 22. A first case through hole 25 passes through each recessed portion 24 in the vertical direction.

The frame 12 is made of an insulating synthetic resin material. The frame 12 has a substantially rectangular shape as viewed from above. The external size of the frame 12 is set to be slightly smaller than that of the bottom wall 18 of the second case 16 and that of the top wall 22 of the first case 17.

A frame through hole 26 that extends in the vertical direction is provided passing through each of the four corners of the frame 12 in the vertical direction. The inner diameter size of each frame through hole 26 is set to be smaller than the external size of the shaft portion of a first screw 27 and the external size of the shaft portion of a second screw 28, which will be descried later.

The capacitors 13 are fixed to the upper surface of the frame 12. The capacitors 13 are arranged on the frame 12 at appropriate intervals in the vertical direction and the left-right directions.

Each capacitor 13 has a substantially cylindrical shape. Two lead wires 29 protrude from one end portion of the capacitor 13. A plurality of (four, in this embodiment) capacitors 13 are arranged on the frame 12 in such an orientation that the lead wires 29 face rightward. As shown in FIG. 1, a capacitor cover 30 is placed over the capacitors 13 housed in the frame 12. The capacitor cover 30 is engaged with an engaging portion (not shown) provided on the frame 12 and is thus fixed to the frame 12. The capacitor cover 30 is made of an insulating synthetic resin material. It should be noted that each of the lead wires 29 of the capacitors 13 is bent downward as indicated by a broken line in FIG. 1.

The circuit board 15 is formed in a substantially rectangular shape. A conductive path is formed on the circuit board 15 using a printed wiring technique. The external size of the circuit board 15 is set to be substantially the same as the external size of the frame 12. As shown in FIG. 1, the circuit board 15 is arranged such that its upper surface is placed on the lower surface of the frame 12. Electronic parts 14 for controlling charge and discharge of the capacitors 13 are mounted on the lower surface of the circuit board 15. The electronic parts 14 are soldered to the conductive path of the circuit board 15. The lead wires 29 of the capacitors 13 pass through the circuit board 15 and are soldered to the conductive path of the circuit board 15.

A board through hole 31 is provided passing through each of the four corners of the circuit board 15 in the vertical direction. Ground patterns 32 are formed around each board through hole 31 on the upper surface and the lower surface of the circuit board 15.

A columnar portion 33 extending upward is formed at each of the four corners of the frame 12. The columnar portion 33 has a substantially circular cross-sectional shape. The above-mentioned frame through hole 26 is provided in the columnar portion 33.

Figure 4:
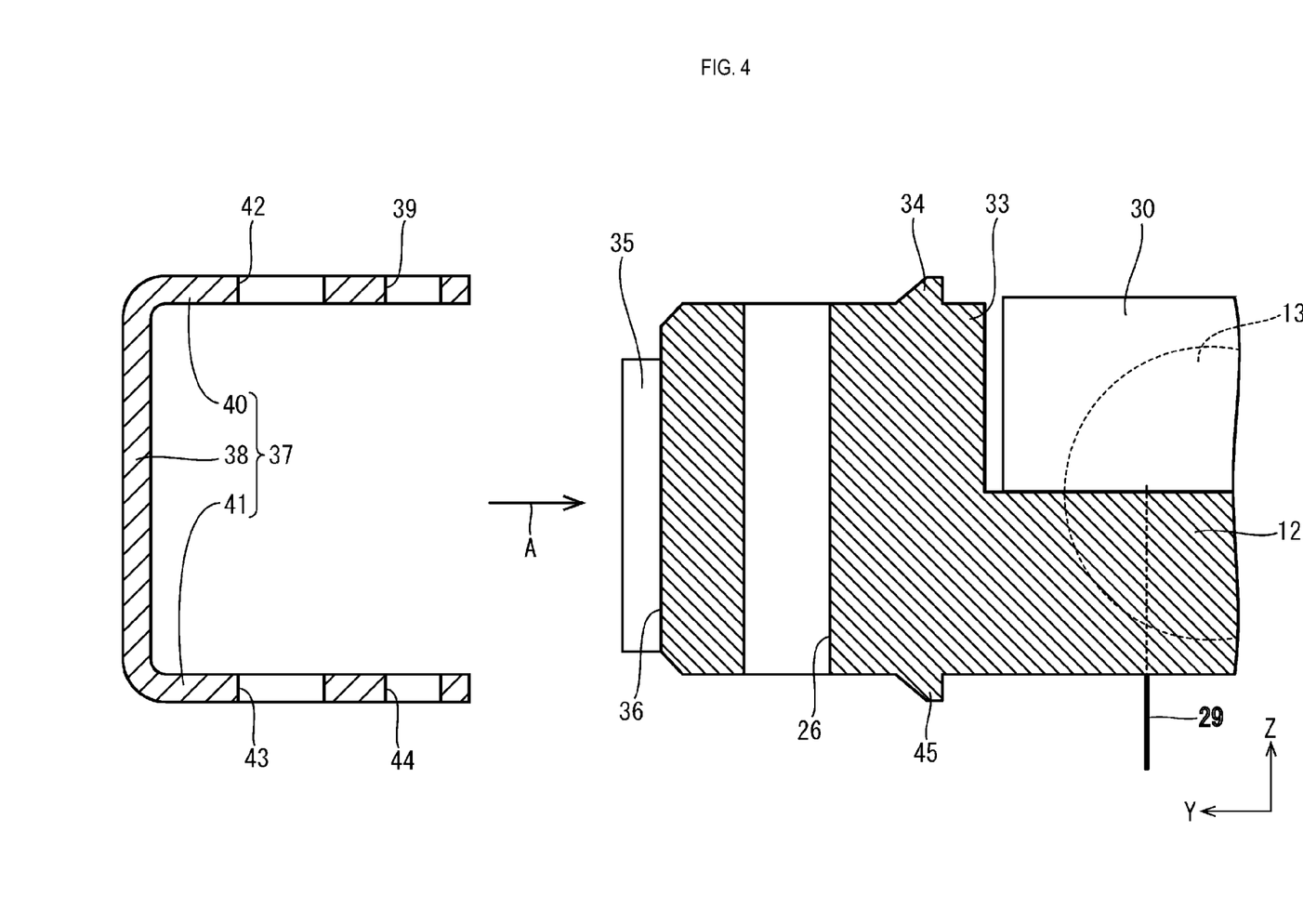
FIG. 4 is a partially enlarged cross-sectional view illustrating a step of attaching a relay member to a frame.

As shown in FIG. 4, a first temporary locking protrusion 34 (an example of a first temporary locking means) protruding upward is formed on the upper surface of the columnar portion 33 at a position that is slightly spaced apart from the hole edge of the frame through hole 26 and is located on the inner side of the frame 12 in the front-rear direction. The first temporary locking protrusion 34 includes a portion that rises on the inner side of the frame 12 in the front-rear direction, and a portion that inclines on the outer side of the frame 12 in the front-rear direction.

A second temporary locking protrusion 45 (an example of a second temporary locking means) protruding downward is formed on the lower surface of the columnar portion 33 at a position that is slightly spaced apart from the hole edge of the frame through hole 26 and is located on the inner side of the frame 12 in the front-rear direction. The second temporary locking protrusion 45 includes a portion that rises on the inner side of the frame 12 in the front-rear direction, and a portion that inclines on the outer side of the frame 12 in the front-rear direction.

Two groove walls 35 that extend in the vertical direction are formed at a position located on the outer side of the frame 12 in the front-rear direction on the side surface of the columnar portion 33. A holding groove 36 is formed between the two groove walls 35. The holding groove 36 is configured to hold a coupling portion 38 of a relay member 37, which will be described later. The width of the holding groove 36 in the left-right direction is set to a size that allows the coupling portion 38 to be accommodated therein.

Figure 5:
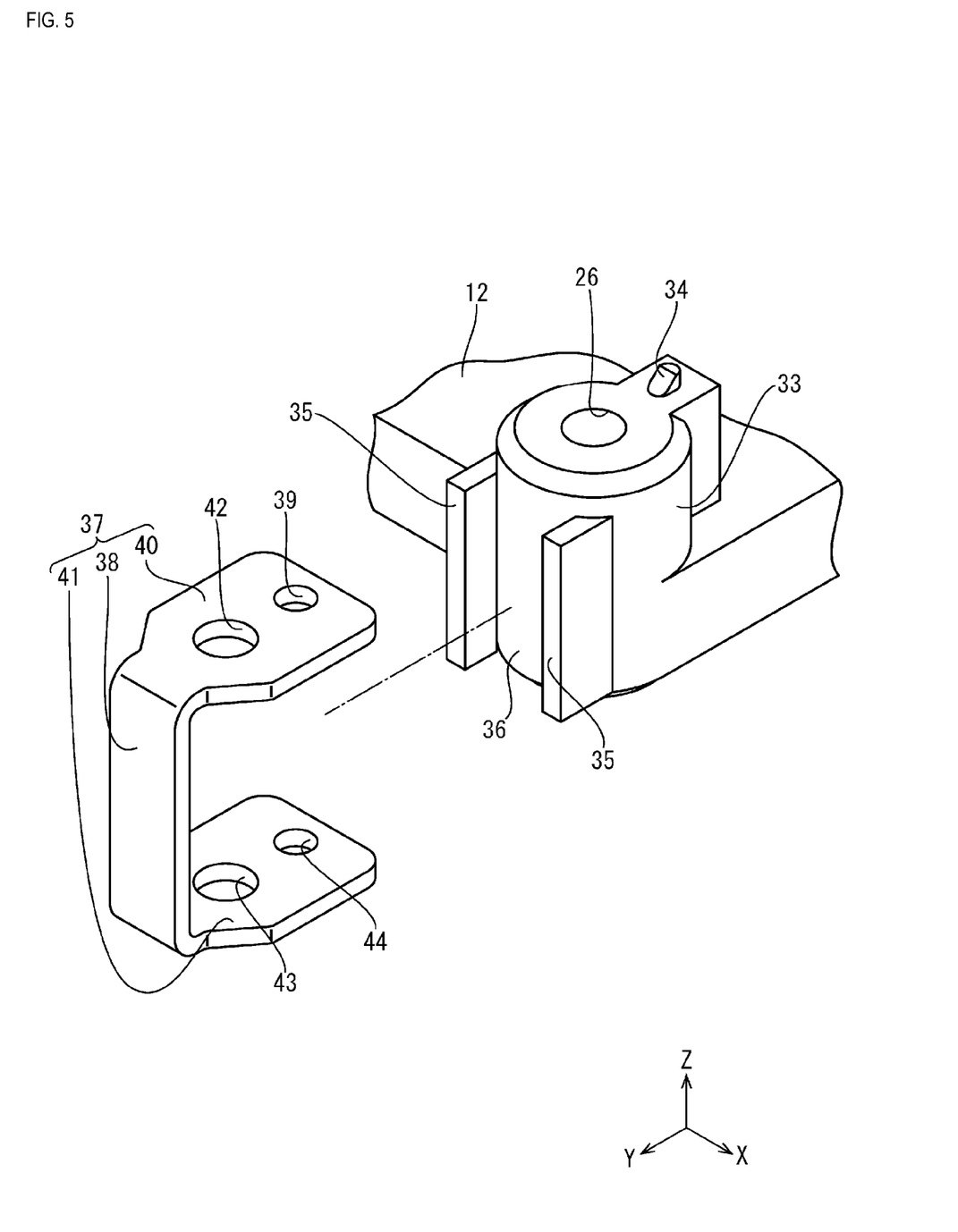
FIG. 5 is a partially enlarged perspective view illustrating the step of attaching the relay member to the frame.
Figure 6:
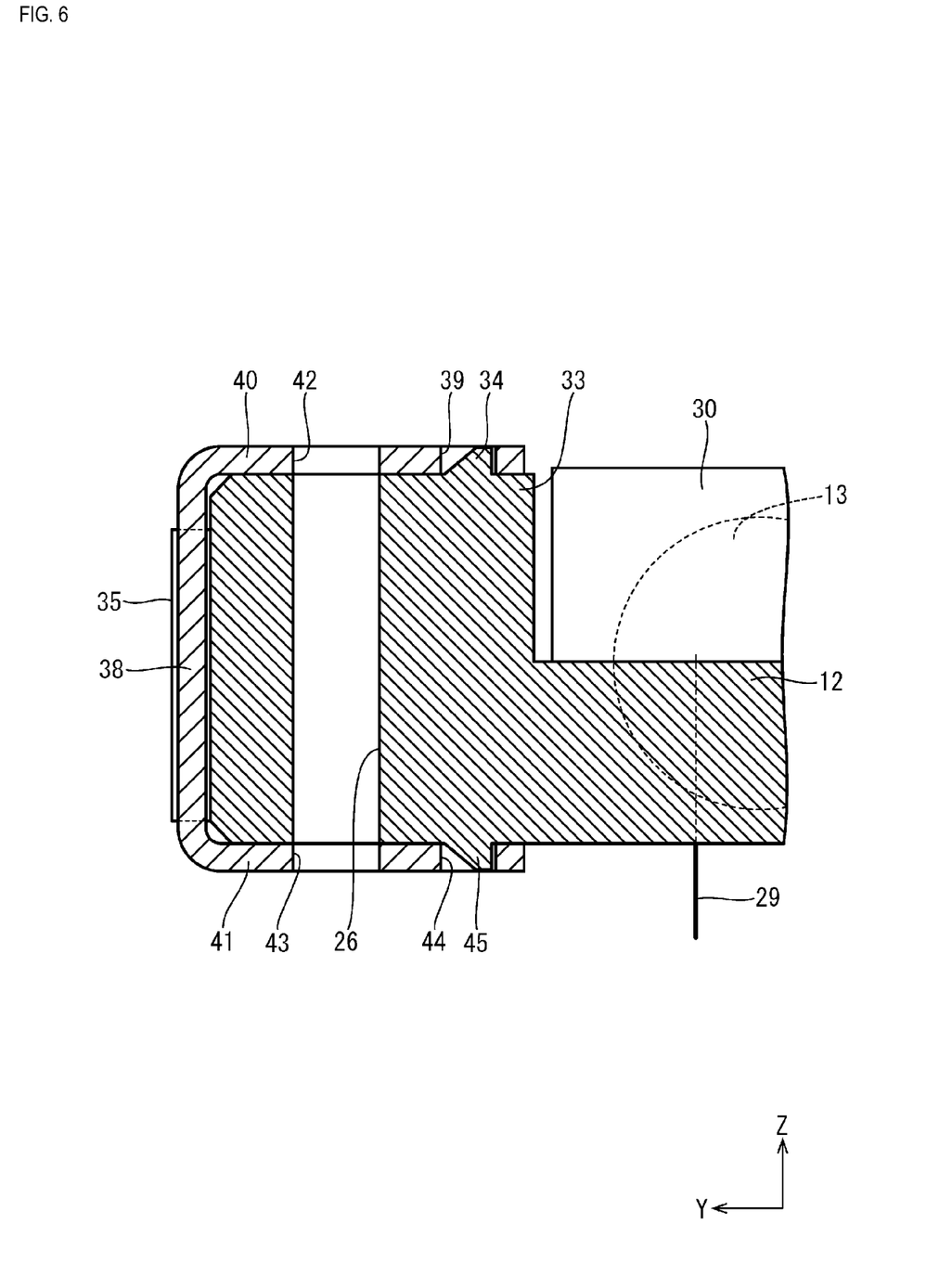
FIG. 6 is a partially enlarged cross-sectional view illustrating a state in which the relay member has been attached to the frame.

As shown in FIG. 5, the relay member 37 is formed by pressing a metal plate material into a predetermined shape.

As a metal constituting the relay member 37, any metal such as copper, a copper alloy, aluminum, or an aluminum alloy can be appropriately selected as needed. A plating layer may be formed on the surface of the relay member 37. As a metal constituting the plating layer, any metal such as tin or nickel can be appropriately selected as needed.

The relay member 37 includes a first connection portion 40 having a substantially rectangular shape as viewed from above, a second connection portion 41 having substantially the same shape as that of the first connection portion 40, and a coupling portion 38 that couples the first connection portion 40 and the second connection portion 41.

The first connection portion 40 is provided with a first through hole 42 that passes therethrough in the vertical direction. The first connection portion 40 is provided with a first temporary locking hole 39 (an example of a first temporary locking means) that passes therethrough in the vertical direction at a position opposite to the coupling portion 38 with respect to the first through hole 42. The inner diameter size of the first temporary locking hole 39 is smaller than the inner diameter size of the first through hole 42. The first temporary locking protrusion 34 is to be inserted into the first temporary locking hole 39.

The second connection portion 41 is provided with a second through hole 43 that passes therethrough in the vertical direction. The second connection portion 41 is provided with a second temporary locking hole 44 (an example of a second temporary locking means) that passes therethrough in the vertical direction at a position opposite to the coupling portion 38 with respect to the second through hole 43. The inner diameter size of the second temporary locking hole 44 is smaller than the inner diameter size of the second through hole 43. The second temporary locking protrusion 45 is to be inserted into the second temporary locking hole 44.

As shown in FIG. 3, the first connection portion 40 of the relay member 37 is placed on the upper surface of the columnar portion 33 of the frame 12, and the recessed portion 24 of the first case 17 is placed on the first connection portion 40. In this state, the frame through hole 26 of the columnar portion 33, the first through hole 42, and the first case through hole 25 are arranged at a corresponding position.

A shaft portion 46 of a first screw 27 is inserted into the first through hole 42 and the first case through hole 25. The shaft portion 46 of the first screw 27 is screwed into the frame through hole 26. The first screw 27 of this embodiment is a so-called self-tapping screw. The first case 17 and the first connection portion 40 are sandwiched between the head portion of the first screw 27 and the upper surface of the columnar portion 33 and are thus electrically connected to each other.

As shown in FIG. 3, the second connection portion 41 of the relay member 37 is placed on the lower surface of the columnar portion 33 of the frame 12, and the circuit board 15 is placed underneath the second connection portion 41. The recessed portion 20 of the second case 16 is placed on the lower surface of the circuit board 15. In this state, the frame through hole 26 of the columnar portion 33, the second through hole 43, the board through hole 31, and the second case through hole 21 are arranged at a corresponding position.

A shaft portion 47 of the second screw 28 is inserted into the second through hole 43, the board through hole 31, and the second case through hole 21. The shaft portion 47 of the second screw 28 is screwed into the frame through hole 26. The second screw 28 of this embodiment is a so-called self-tapping screw. The second case 16, the ground patterns 32 of the circuit board 15, and the second connection portion 41 are sandwiched between the head portion of the second screw 28 and the lower surface of the columnar portion 33 and are thus electrically connected to each other.

Next, an example of a step of assembling the electronic unit 10 of this embodiment will be described. The description below is an example of the assembling step, and the assembly order of the members is not limited to the description below.

The capacitors 13 are arranged on the upper surface of the frame 12, and then the capacitors 13 are fixed to the frame 12 by attaching the capacitor cover 30 thereto from above.

As shown in FIGS. 4 and 5, the relay member 37 is attached to the columnar portion 33 of the frame 12 from the outside of the frame 12 in the front-rear direction (in the direction indicated by arrow A). As a result, the lower surface of the first connection portion 40 comes into sliding contact with the upper surface of the columnar portion 33, and the upper surface of the second connection portion 41 comes into sliding contact with the lower surface of the columnar portion 33. When the relay member 37 is brought closer to the columnar portion, the first connection portion 40 moves up the oblique surface of the first temporary locking protrusion 34, and the second connection portion 41 moves up the oblique surface of the second temporary locking protrusion 45. As a result, the relay member 37 deformas such that the distance between the first connection portion 40 and the second connection portion 41 increases. When the relay member 37 is brought even closer to the columnar portion, the relay member 37 deforms such that the first connection portion 40 and the second connection portion 41 are restored. Then, the first temporary locking protrusion 34 is inserted into the first temporary locking hole 39, and the second temporary locking protrusion 45 is inserted into the second temporary locking hole 44. As a result, separation of the relay member 37 from the columnar portion 33 is suppressed, and the relay member 37 is temporarily locked to the columnar portion 33 (see FIG. 6). At this time, the coupling portion 38 is accommodated inside the holding groove 36 of the columnar portion 33. The above-mentioned step is performed on the four columnar portions 33 formed at the four corners of the frame 12.

The electronic parts 14 are mounted on the lower surface of the circuit board 15. The circuit board 15 on which the electronic parts 14 are mounted is housed inside the second case 16. At this time, the circuit board 15 is arranged such that the board through holes 31 of the circuit board 15 correspond to the second case through holes 21.

The frame 12 is placed on the circuit board 15. At this time, the board through holes 31 are aligned with the frame through holes 26.

The first case 17 is attached from above the second case 16, the circuit board 15, and the frame 12. At this time, the first case through holes 25 are aligned with the frame through holes 26. In addition, the side wall 23 of the first case 17 is fitted over the side wall 19 of the second case 16.

The shaft portions 46 of the first screws 27 are inserted through the first case through holes 25, and are screwed into the frame through holes 26 of the columnar portions 33. In addition, the shaft portions 47 of the second screws 28 are inserted through the second case through holes 21, and are screwed into the frame through holes 26 of the columnar portions 33.

Accordingly, the first case 17 and the second case 16 are fixed to the frame 12. Furthermore, the first case 17 and the second case 16 are electrically connected to each other via the relay members 37. Moreover, the first case 17 and the second case 16 are electrically connected to the ground patterns 32 of the circuit board 15 via the relay members 37. The electronic unit 10 is thus completed (see FIGS. 1 and 3).

Subsequently, the functions and effects of this embodiment will be described. With this embodiment, the electronic unit 10 includes: the first case 17 made of metal; the second case 16 made of metal; the frame 12 made of synthetic resin arranged inside an assembly of the first case 17 and the second case 16; the relay members 37 made of metal that are separate from the frame 12 and each include the first connection portion 40 electrically connected to the first case 17, the second connection portion 41 electrically connected to the second case 16, and the coupling portion 38 coupling the first connection portion 40 and the second connection portion 41; first screws 27 that pass through the first case 17 and the first connection portions 40 from the outside of the first case 17 and are fixed to the frame 12; and the second screws 28 that pass through the second case 16 and the second connection portions 41 from the outside of the second case 16 and are fixed to the frame 12.

With the above-mentioned configuration, the first case 17 can be removed from the frame 12 by removing the first screws 27 from the frame 12, and the second case 16 can be removed from the frame 12 by removing the second screws 28 from the frame 12. Accordingly, the first case 17 and the second case 16 can be easily removed from the frame in the electronic unit 10 that is electromagnetically shielded by the first case 17 and second case 16, which are made of metal, thus making it possible to improve the ease of performing maintenance on the electronic unit 10.

With this embodiment, the frame 12 includes the holding grooves 36 that hold the coupling portions 38. This configuration facilitates the positioning of the relay members 37 relative to the frame 12.

With this embodiment, the electronic unit 10 includes the first temporary locking protrusions 34 and first temporary locking holes 39 for temporarily locking the first connection portions 40 to the frame 12, and the second temporary locking protrusions 45 and second temporary locking holes 44 for temporarily locking the second connection portion 41 to the frame 12. This configuration makes it easy to attach the relay members 37 to the frame 12.

With this embodiment, the circuit board 15 is arranged inside the assembly of the first case 17 and the second case 16, and the ground patterns 32 that are electrically connected to the second connection portions 41 are formed on the circuit board 15. With this configuration, the ground patterns 32 of the circuit board 15 are electrically connected to the second connection portions 41. Thus, the ground patterns 32 of the circuit board 15 and the first case 17 are electrically connected via the coupling portions 38 and the first connection portions 40. As a result, the circuit board 15 can be protected from noise, and the leakage of noise produced by the circuit board 15 to the outside can be suppressed.

Embodiment 2

Figure 7:
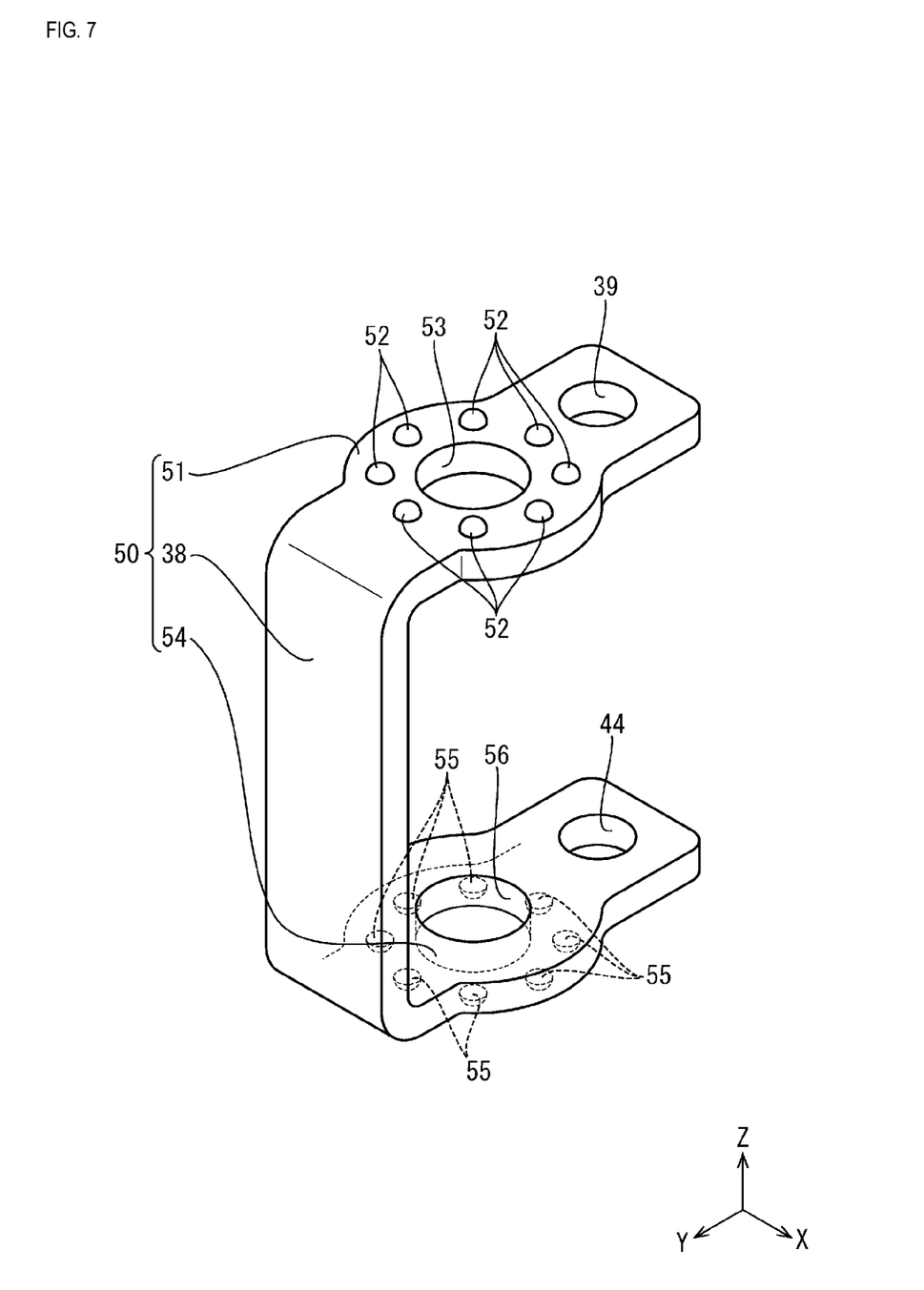
FIG. 7 is a perspective view of a relay member according to Embodiment 2.

Next, Embodiment 2 will be described with reference to FIG. 7. A relay member 50 according to this embodiment is provided with a plurality of (eight, in this embodiment) first contact protrusions 52 protruding upward on the upper surface of a first connection portion 51. The first case 17 is placed on the upper surface of the first connection portion 51, and therefore, the first contact protrusions 52 are configured to protrude in a direction in which they approach the first case 17. The first contact protrusions 52 are provided at intervals in the circumferential direction around a first through hole 53. Each first contact protrusion 52 has a hemispherical shape.

A plurality of (eight, in this embodiment) second contact protrusions 55 protruding downward are provided on the lower surface of a second connection portion 54. The second case 16 is placed on the lower side of the second connection portion 54, and therefore, the second contact protrusions 55 are configured to protrude in a direction in which they approach the second case 16. The second contact protrusions 55 are provided at intervals in the circumferential direction around a second through hole 56. Each second contact protrusion 55 has a hemispherical shape.

With this embodiment, the first connection portions 51 are electrically connected to the first case 17 via the first contact protrusions 52. As a result, the electrical connection portion can be reliably designed, thus making it possible to improve the reliability of electrical connection between the first connection portions 51 and the first case 17.

With this embodiment, the second connection portions 54 are electrically connected to the ground patterns 32 of the circuit board 15 via the second contact protrusions 55. As a result, the electrical connection portion can be reliably designed, thus making it possible to improve the reliability of electrical connection between the second connection portions 54 and the ground patterns 32 of the circuit board 15.

Since configurations other than the above-mentioned configurations are substantially the same as those of Embodiment 1, the same members are denoted by the same reference numerals, and redundant descriptions are omitted.

Embodiment 3

Figure 8:
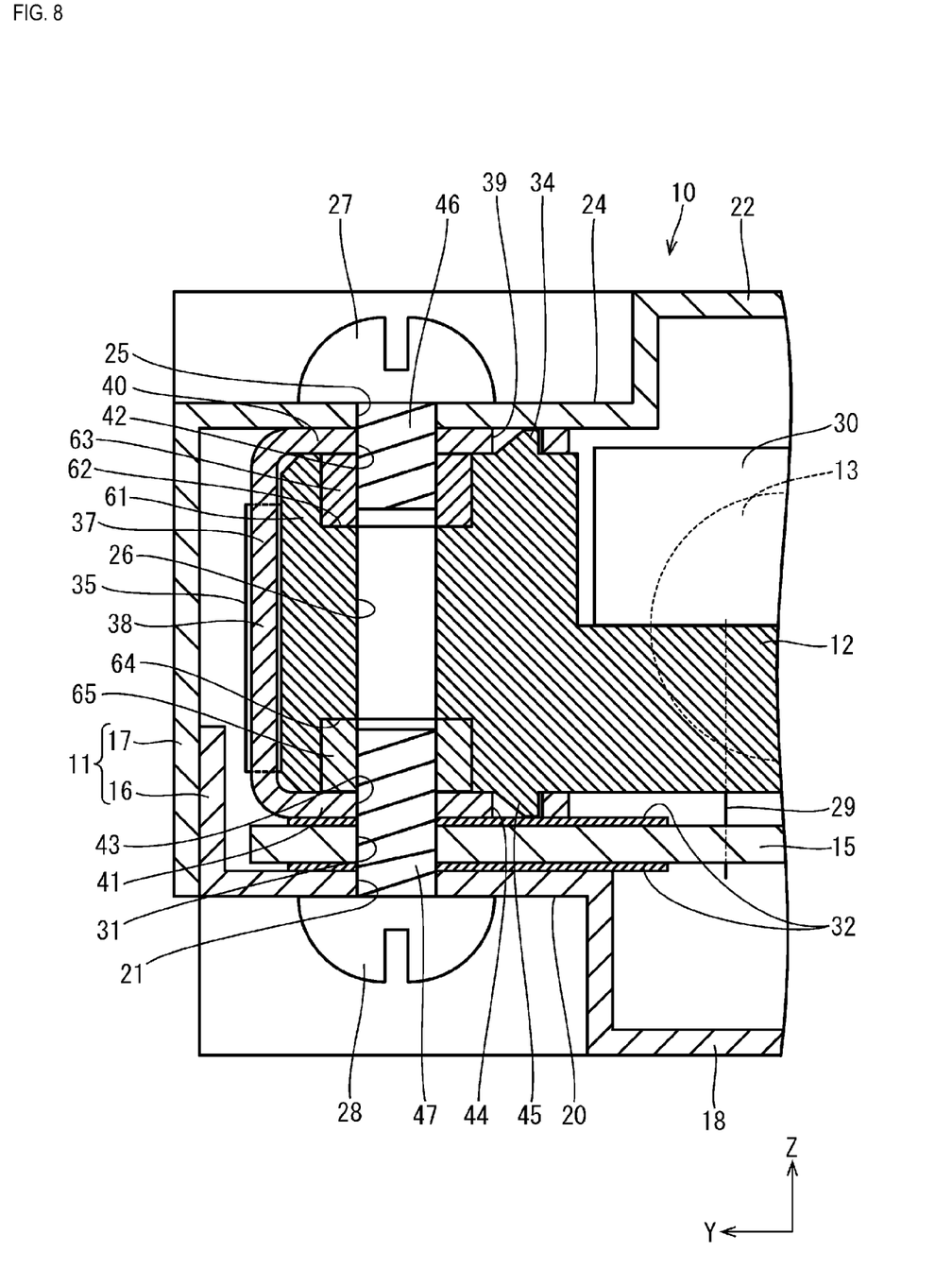
FIG. 8 is a partially enlarged cross-sectional view of an electronic unit according to Embodiment 3.

Next, Embodiment 3 will be described with reference to FIG. 8. In this embodiment, a first housing recessed portion 62 is formed in the upper portion of a columnar portion 61 of a frame 60. A first nut 63 is arranged inside the first housing recessed portion 62 with a clearance in a state in which the first nut 63 is prevented from dislodging from the first housing recessed portion 62 is prevented.

In addition, a second housing recessed portion 64 is formed in the lower portion of the columnar portion 61 of the frame 60. A second nut 65 is arranged inside the second housing recessed portion 64 with a clearance in a state in which the dislodgement of the second nut 65 from the second housing recessed portion 64.

In this embodiment, the first nut 63 and the second nut 65 are arranged with a clearance relative to the columnar portion. With this configuration, even if thermal expansion or thermal shrinkage repeatedly occurs, the application of force caused by a difference between linear expansion coefficients between the columnar portion 61 and the first nut 63 and between the columnar portion 61 and the second nut 65 is suppressed.

Since configurations other than the above-mentioned configurations are substantially the same as those of Embodiment 1, the same members are denoted by the same reference numerals, and redundant descriptions are omitted.

Other Embodiments

The technology disclosed in this specification is not limited to the embodiments described in the description above and the drawings, and the following embodiments can also be implemented, for example.

Although the embodiments have a configuration in which the four corners of the case 11 are screwed, there is no limitation thereto, and a configuration may also be employed in which the first case and the second case are screwed to each other at the central portion of the case 11. The case 11 can be screwed at any position.

Any shape such as a circular shape or an elliptical shape can be selected as appropriate as the shapes of the first connection portions 40 and the second connection portions 41.

The holding grooves may be omitted.

The first temporary locking protrusions 34 and the first temporary locking holes 39 may be omitted. In addition, the second temporary locking protrusions 45 and the second temporary locking holes 44 may be omitted.

Although the above-mentioned embodiments have a configuration in which the frame 12 holding the capacitors 13 and the circuit board 15 are housed in the case 11, the disclosure of this application is not limited to this configuration and can also be applied to an electronic unit including a case 11 in which only a holder holding capacitors 13 is housed.

Although the embodiments have a configuration in which the electronic unit 10 has the capacitors in the case 11, there is no limitation to this configuration, and a configuration may also be employed in which the electronic unit 10 has a secondary battery in the case 11.

The number of capacitors 13 housed in the case 11 may be one to three or five or more. Although the capacitors 13 are examples of parts to be held by the frame in the embodiments, the capacitors 13 can also be exchanged for parts that are different from the capacitors 13 and are tall parts that produce noise. There is no limitation on the arrangement of the capacitors 13.

One or both types of the first contact protrusion and the second contact protrusion may also be omitted.

The invention claimed is:

1. An electronic unit comprising:
a first case made of metal;
a second case made of metal;
a frame made of synthetic resin arranged inside an assembly of the first case and the second case;
a relay member made of metal that is separate from the frame and includes a first connection portion electrically connected to the first case, a second connection portion electrically connected to the second case, and a coupling portion coupling the first connection portion and the second connection portion;
a first screw that passes through the first case and the first connection portion from the outside of the first case and is fixed to the frame; and
a second screw that passes through the second case and the second connection portion from the outside of the second case and is fixed to the frame.

2. The electronic unit according to claim 1, wherein the relay member includes at least one of a first contact protrusion protruding from the first connection portion toward the first case and a second contact protrusion protruding from the second connection portion toward the second case.

3. The electronic unit according to claim 1, wherein the frame includes a holding groove that holds the coupling portion.

4. The electronic unit according to claim 1, comprising at least one of:
a first temporary locking means that temporarily locks the first connection portion to the frame; and
a second temporary locking means that temporarily locks the second connection portion to the frame.

5. The electronic unit according to claim 1,
wherein a circuit board is arranged inside the assembly of the first case and the second case, and
a ground pattern formed on the circuit board, the ground pattern is electrically connected to at least one of the first connection portion and the second connection portion.

6. The electronic unit according to claim 2, wherein the frame includes a holding groove that holds the coupling portion.

7. The electronic unit according to claim 2, comprising at least one of:
a first temporary locking means that temporarily locks the first connection portion to the frame; and
a second temporary locking means that temporarily locks the second connection portion to the frame.

8. The electronic unit according to claim 3, comprising at least one of:
a first temporary locking means that temporarily locks the first connection portion to the frame; and
a second temporary locking means that temporarily locks the second connection portion to the frame.

9. The electronic unit according to claim 2,
wherein a circuit board is arranged inside the assembly of the first case and the second case, and
a ground pattern formed on the circuit board, the ground pattern is electrically connected to at least one of the first connection portion and the second connection portion.

10. The electronic unit according to claim 3,
wherein a circuit board is arranged inside the assembly of the first case and the second case, and
a ground pattern formed on the circuit board, the ground pattern is electrically connected to at least one of the first connection portion and the second connection portion.

11. The electronic unit according to claim 4,
wherein a circuit board is arranged inside the assembly of the first case and the second case, and
a ground pattern formed on the circuit board, the ground pattern is electrically connected to at least one of the first connection portion and the second connection portion.

* * * * *